(12) United States Patent
Wang et al.

(10) Patent No.: US 10,559,374 B2
(45) Date of Patent: Feb. 11, 2020

(54) CIRCUIT TOPOLOGY OF MEMORY CHIPS WITH EMBEDDED FUNCTION TEST PATTERN GENERATION MODULE CONNECTED TO NORMAL ACCESS PORT PHYSICAL LAYER

(71) Applicant: Piecemakers Technology, Inc., Hsinchu (TW)

(72) Inventors: Gyh-Bin Wang, Hsinchu County (TW); Chun-Kai Wang, Miaoli County (TW)

(73) Assignee: Piecemakers Technology, Inc., Hsinchu (TW)

( * ) Notice: Subject to any disclaimer, the term of this patent is extended or adjusted under 35 U.S.C. 154(b) by 19 days.

(21) Appl. No.: 15/436,880

(22) Filed: Feb. 20, 2017

(65) Prior Publication Data

US 2018/0240531 A1 Aug. 23, 2018

(51) Int. Cl.
*G11C 29/12* (2006.01)
*G11C 29/36* (2006.01)
*G11C 29/48* (2006.01)
*G11C 29/54* (2006.01)

(52) U.S. Cl.
CPC .......... *G11C 29/1201* (2013.01); *G11C 29/36* (2013.01); *G11C 29/48* (2013.01); *G11C 2029/3602* (2013.01)

(58) Field of Classification Search
CPC ........ G11C 2029/3602; G11C 29/1201; G11C 29/36; G11C 29/48; G11C 29/30
See application file for complete search history.

(56) References Cited

U.S. PATENT DOCUMENTS

| | | | | |
|---|---|---|---|---|
| 6,349,064 | B1* | 2/2002 | Nakaoka | G11C 29/24 365/200 |
| 6,892,337 | B1* | 5/2005 | Brophy | G01R 31/31715 375/221 |
| 2004/0218440 | A1 | 11/2004 | Kumar | |
| 2005/0002253 | A1* | 1/2005 | Shi | G11C 11/406 365/222 |
| 2005/0138500 | A1* | 6/2005 | Sul | G01R 31/31926 714/724 |
| 2005/0289428 | A1* | 12/2005 | Ong | G01R 31/31723 714/742 |
| 2006/0155882 | A1* | 7/2006 | Jochemsen | G06F 11/1068 710/3 |
| 2008/0136847 | A1* | 6/2008 | Yajima | G09G 3/3688 345/690 |
| 2008/0201623 | A1* | 8/2008 | Reggiori | G11C 29/1201 714/719 |
| 2015/0332787 | A1* | 11/2015 | Lee | G11C 29/023 714/718 |

* cited by examiner

*Primary Examiner* — April Y Blair
*Assistant Examiner* — Dipakkumar B Gandhi
(74) *Attorney, Agent, or Firm* — Winston Hsu

(57) ABSTRACT

A memory chip architecture includes a plurality of test pads, a plurality of interface pads, a function block and an embedded test block. The function block is coupled to the interface pads. The embedded test block is coupled to the test pads. The embedded test block is connected to an access port physical layer (PHY) through the interface pads. The interface pads are disposed between the function block and the embedded test block. The embedded test block is arranged for generating at least one test pattern as a test signal, and outputting the test signal to the function block through the interface pads to test the function block.

3 Claims, 2 Drawing Sheets

CIRCUIT TOPOLOGY OF MEMORY CHIPS WITH EMBEDDED FUNCTION TEST PATTERN GENERATION MODULE CONNECTED TO NORMAL ACCESS PORT PHYSICAL LAYER

BACKGROUND OF THE INVENTION

1. Field of the Invention

The disclosed embodiments of the present invention relate to a memory architecture, and more particularly, to a circuit topology of memory chips with an embedded function test pattern generation module connected to a normal access PHY (Port Physical Layer)/regular interface pads, which transmits a test signal to a chip including a functional circuit through a plurality of the regular interface pads.

2. Description of the Prior Art

In high-performance computing and graphics applications, demand for higher bandwidth DRAM continues to increase. Memories with large number of I/O pins have been developed for the demand in years, such as High Bandwidth Memory (HBM) and Wide I/O DRAM. As the configuration of memories has hundreds of interface pads, it would be a challenge to do wafer level testing due to its high pad counts. Normally, in addition to the exiting interface pads of the memory, an extra test pad interface is equipped for wafer probe test, because the interface pads are too numerous and designed too small to be directly probed. An extra set of test pads are not only equipped for direct access but also decrease the pad counts for wafer level testing.

In order to do the wafer test of the high bandwidth memories under the limited number of test pads, an extra test circuit connecting to the test pads is developed. Traditionally, the test circuit sends the test signals to the core circuit through extra paths that will disturb the original signal path, and the interface circuits are tested locally, however, and are independent to the core circuit.

To make the wafer level testing realistic to normal operation, there is a need for regular interface pads connection test scheme.

SUMMARY OF THE INVENTION

In accordance with exemplary embodiments of the present invention, a single die including an embedded test module conterminous with a core circuit on a regular interface, which transmits a test signal to the core circuit through regular access interface pads in the regular interface, is proposed to solve the above mentioned problems.

According to an embodiment of the present invention, an exemplary memory chip architecture is disclosed. The exemplary memory chip architecture comprises a plurality of test pads, a plurality of interface pads, a function block and an embedded test block. The function block is coupled to the interface pads. The embedded test block is coupled to the test pads, wherein the embedded test block is connected to an access port physical layer (PHY) through the interface pads, and the interface pads are disposed between the function block and the embedded test block; and the embedded test block is arranged for generating at least one test pattern as a test signal, and outputting the test signal to the function block through the interface pads to test the function block.

As the proposed memory chip architecture (or a circuit topology of memory chips) may transmit a test signal through normal access interface pads to test a die operation, rather than test a chip having a functional circuit (or a memory core circuit) through extra testing path(s), an obtained test result of the proposed circuit topology is the same as a test result of a control chip/system externally connected to the proposed circuit topology. Each of the proposed circuit topology and the control chip/system transmits signals through the normal access interface pads only so that the test behavior of the proposed circuit topology is similar/identical to that of the control chip/system.

These and other objectives of the present invention will no doubt become obvious to those of ordinary skill in the art after reading the following detailed description of the preferred embodiment that is illustrated in the various figures and drawings.

DETAILED DESCRIPTION

The proposed circuit topology of memory chips with an embedded function test pattern generation module connected to an access PHY (i.e. a normal access PHY) may include a function block, an embedded test block (i.e. the embedded function test pattern generation module) and a plurality of interface pads (or regular interface pads), wherein the circuit topology receives and outputs signals through the normal access PHY. Additionally, the embedded test block (or a test circuit of the embedded test block) transmits a test signal through the interface pads to test the function block (or a functional circuit of the function block) rather than tests the function block through extra paths. By way of example but not limitation, the test signal generated from the embedded test block and control signal (s) generated from a control chip or a control system may be transmitted only through the interface pads/the access PHY. Hence, a test result corresponding to a test pattern generated by the embedded test block may be similar/identical to a test result corresponding to a test pattern generated by a control chip/system externally connected to the proposed circuit topology (or the proposed memory chip architecture) since the respective test patterns are transmitted through the normal access PHY only.

Figure 1:
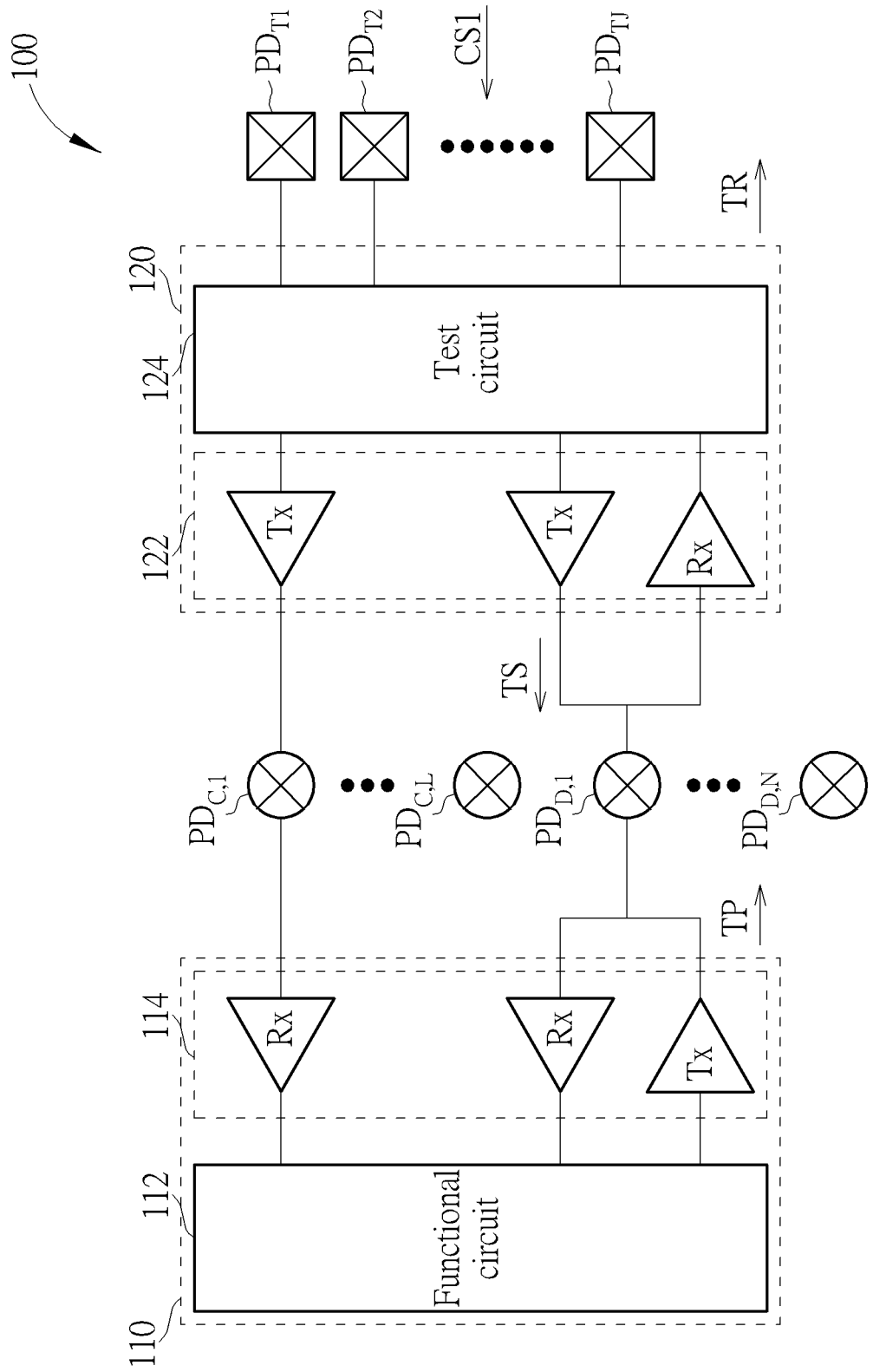
FIG. 1 is a diagram illustrating an exemplary memory chip architecture according to an embodiment of the present invention.

Please refer to FIG. 1, which is a diagram illustrating an exemplary memory chip architecture (or a die architecture) according to an embodiment of the present invention. The memory chip architecture may include, but is not limited to, a function block 110 (e.g. a function circuitry or integrated circuit chip), an embedded test block 120 (e.g. an embedded test circuitry or integrated circuit chip), a plurality of interface pads $PD_{C,1}$-$PD_{C,L}$ and $PD_{D,1}$-$PD_{D,N}$ (e.g. regular interface pads associated with an access PHY), and a plurality of test pads $PD_{T1}$-$PD_{TJ}$, wherein L and N are positive integers, and J is a positive integer greater than 1. The interface pads $PD_{C,1}$-$PD_{C,L}$ and $PD_{D,1}$-$PD_{D,N}$ (hereinafter represented by "$PD_{C,1}$-$PD_{D,N}$" for the sake of brevity) are disposed between the function block 110 and the embedded test block 120, and the embedded test block 120 is connected to the access PHY through the interface pads $PD_{C,1}$-$PD_{D,N}$ and is further coupled to the test pads $PD_{T1}$-$PD_{TJ}$. Hence, when generating a test signal TS, the embedded test block 120 may output the test signal TS to the function block 110 through the interface pads $PD_{C,1}$-$PD_{D,N}$, thereby performing a die test operation.

In this embodiment, the function block 110 and the test embedded block 120 may be separately disposed in memory chip architecture 100, wherein the function block 110 may include a functional circuit 112 (e.g. implemented by a memory core circuit) and an input/output (I/O) circuit 114, wherein the I/O circuit 114 is coupled between the functional circuit 112 and the interface pads $PD_{C,1}$-$PD_{D,N}$. In a case where the embedded test block 120 transmits the test signal TS through the $PD_{C,1}$-$PD_{D,N}$ to perform the die test operation, the test signal TS may be transmitted through the I/O circuit 114 first and then the functional circuit 112 to verify die/chip functions. Additionally, an output signal TP generated by the function block 110 in response to the test signal TS may be transmitted to the test embedded block 120 through the interface pads $PD_{C,1}$-$PD_{D,N}$. Hence, the die test operation may not only verify the die/chip functions of the functional circuit 112 but also detect electrical characteristics of the I/O circuit 114.

By way of example but not limitation, a part of the interface pads $PD_{C,1}$-$PD_{D,N}$ (the interface pads $PD_{C,1}$-$PD_{C,L}$) may be used for transmitting a command/address component of the test signal TS to the function block 110; another part of the interface pads $PD_{C,1}$-$PD_{D,N}$ (the pads $PD_{D,1}$-$PD_{D,N}$, referred to as I/O pads) may be used for transmitting a data component of the test signal TS (e.g. test pattern(s)) to the function block 110, and/or transmitting the output signal TP to the embedded test block 120.

The following describes an implementation of the die test operation performed by the embedded test block 120. First, the embedded test block 120 may receive a control input CS1 through the test pads $PD_{T1}$-$PD_{TJ}$, and generate the test signal TS according to the control input CS1. The embedded test block 120 may include, but is not limited to, an I/O circuit 122 and a test circuit 124, wherein the test signal TS generated from the test circuit 124 may be transmitted to the interface pads $PD_{C,1}$-$PD_{D,N}$ through the I/O circuit 122. The I/O circuit 122 may include a plurality of tri-state buffers (or transmitter buffers; labeled Tx) and a plurality of receiver buffers (labeled Rx), wherein any one of tri-state buffers coupled to the interface pads $PD_{C,1}$-$PD_{C,L}$ may be used for transmitting a command/address component of the test signal TS, and any one of tri-state buffers coupled to the interface pads $PD_{D,1}$-$PD_{D,N}$ may be used for transmitting a data component of the test signal TS.

Next, the I/O circuit 114 may receive the test signal TS through the interface pads $PD_{C,1}$-$PD_{D,N}$. The I/O circuit 114 may include, but is not limited to, a plurality of receiver buffers (labeled Rx) and a plurality of tri-state buffers (or transmitter buffers; labeled Tx), wherein any one of receiver buffers coupled to the interface pads $PD_{C,1}$-$PD_{C,L}$ may be used for receiving a command/address component of the test signal TS, and any one of receiver buffers coupled to the interface pads $PD_{D,1}$-$PD_{D,N}$ may be used for receiving a data component of the test signal TS. After the I/O circuit 114 receives the test signal TS, the function block 110 (or the functional circuit 112) may generate the output signal TP in response to the test signal TS, and output the output signal TP through the tri-state buffers of the I/O circuit 114 to the interface pads $PD_{D,1}$-$PD_{D,N}$. The test circuit 124 may receive the output signal TP through the receiver buffers of the I/O circuit 122 accordingly.

In view of the above, the test circuit 124 outputs the test signal TS to the functional circuit 112 only through the interface pads $PD_{C,1}$-$PD_{D,N}$ to perform the die test operation so as to test the function block 110, wherein a test path of the memory chip architecture 100 includes the I/O circuit 114. Hence, information indicated by the output signal TP may include electrical characteristics of the I/O circuit 114. In addition, the proposed test scheme may operate the wafer-level test without disturbing the internal function circuit.

Please note that only a part of the test path (i.e. a signal path passing through the interface pads $PD_{C,1}$ and a signal path passing through the interface pads $PD_{D,1}$) is shown in FIG. 1 for the sake of brevity. The test path may further include other interface pads and corresponding receiver/tri-state buffers. By way of example but not limitation, each of the interface pads $PD_{C,1}$-$PD_{C,L}$ is coupled to the function block 110 and the embedded test block 120 in a same/similar manner as the interface pads $PD_{C,1}$. Specifically, the I/O circuit 114 may further receiver buffers which are coupled to the interface pads $PD_{C,1}$-$PD_{C,L}$ respectively, and/or the I/O circuit 122 may further include tri-state buffers which are coupled to the interface pads $PD_{C,1}$-$PD_{C,L}$ respectively (not shown in FIG. 1). In another example, each of the interface pads $PD_{D,1}$-$PD_{D,N}$ is coupled to the function block 110 and the embedded test block 120 in a same/similar manner as the interface pads $PD_{D,1}$. Specifically, the I/O circuit 114 may include N tri-state buffers which are coupled to the interface pads $PD_{D,1}$-$PD_{D,N}$ respectively and N receiver buffers which are coupled to the interface pads $PD_{D,1}$-$PD_{D,N}$ respectively, and/or the I/O circuit 122 may include N tri-state buffers which are coupled to the interface pads $PD_{D,1}$-$PD_{D,N}$ respectively and N receiver buffers which are coupled to the interface pads $PD_{D,1}$-$PD_{D,N}$ respectively (not shown in FIG. 1).

The above-described configuration of interface pads, tri-state buffers and receiver buffers is not meant to be a limitation of the present invention. In alternative design, different interface pads may be coupled to a same tri-state buffer (or a receiver buffer). In another alternative design, different tri-state buffers (or receiver buffers) may be coupled to a same interface pads. In brief, as long as the embedded test block 120 may transmit the test signal TS through a plurality of interface pads to test the function block 110, associated modifications and alternatives fall within the scope of the present invention.

It should be noted that the interface pads $PD_{C,1}$-$PD_{D,N}$ may be implemented by a plurality of pads coupled between a control die/chip/system and the chip with the functional circuit 112 (the function block 110). Please refer to FIG. 2, which is a diagram illustrating an exemplary die with a test chip architecture according to an embodiment of the present invention. In this embodiment, the memory chip architecture 200 may be implemented by the chip with proposed circuit topology (the memory chip architecture 100) shown in FIG. 1, and include the pads $PD_{T1}$-$PD_{TJ}$ shown in FIG. 1, a function block 210, an embedded test block 220 and a plurality of interface pads $PD_{I1}$-$PD_{KK}$ (K is a positive integer greater than 1), wherein the function block 210, the embedded test block 220 and the interface pads $PD_{I1}$-$PD_{KK}$ may be implemented by the function block 110, the embedded test block 120 and the regular interface pads $PD_{C,1}$-$PD_{D,N}$ shown in FIG. 1.

In this embodiment, when the chip with proposed circuit topology (the memory chip architecture 200) operates in a normal operation mode, a control chip 202 (or a control die/system) may generate a control input CS2 to control an access operation (or a die access operation) of the memory chip architecture 200. Specifically, the function block 210 (or a function chip) may receive the control input CS2 generated from the control chip 202 through the interface pads $PD_{I1}$-$PD_{IK}$, and perform the access operation according to the control input CS2. In addition, the function block 210 may output an output signal DS through the interface pads $PD_{I1}$-$PD_{IK}$ in response to the control input CS2. By way of example but not limitation, the function block 210 may output data (carried by the output signal DS) through the interface pads $PD_{I1}$-$PD_{IK}$ in response to a read command indicated by the control input CS2.

When the chip with proposed circuit topology (the memory chip architecture 200) operates in a test mode, a tester 204 may generate the control input CS1 to test the memory chip architecture 200. Specifically, the test block 220 (or a test chip) may receive the control input CS1 through the test pads $PD_{T1}$-$PD_{TJ}$ and generate the test signal TS according to the control input CS1, and the function block 210 may receive the test signal TS through the interface pads $PD_{I1}$-$PD_{IK}$. In addition, the function block 210 may generate the output signal TP in response to the test signal TS. The embedded test block 220 may receive the output signal TP through the interface pads $PD_{I1}$-$PD_{IK}$, and accordingly output a test result TR to the tester 204.

As the embedded test block 220 sends the test signal TS to the function block 210 also through the interface pads $PD_{I1}$-$PD_{IK}$, a signal transmission path corresponding to the die test operation includes an I/O circuit of the function block 210 in a signal transmission path corresponding to the die access operation. In other words, the output signal TP received by the embedded test block 220 (or the test result TR received by the tester 204) may indicate electrical characteristics of the whole function block 210.

Figure 2:
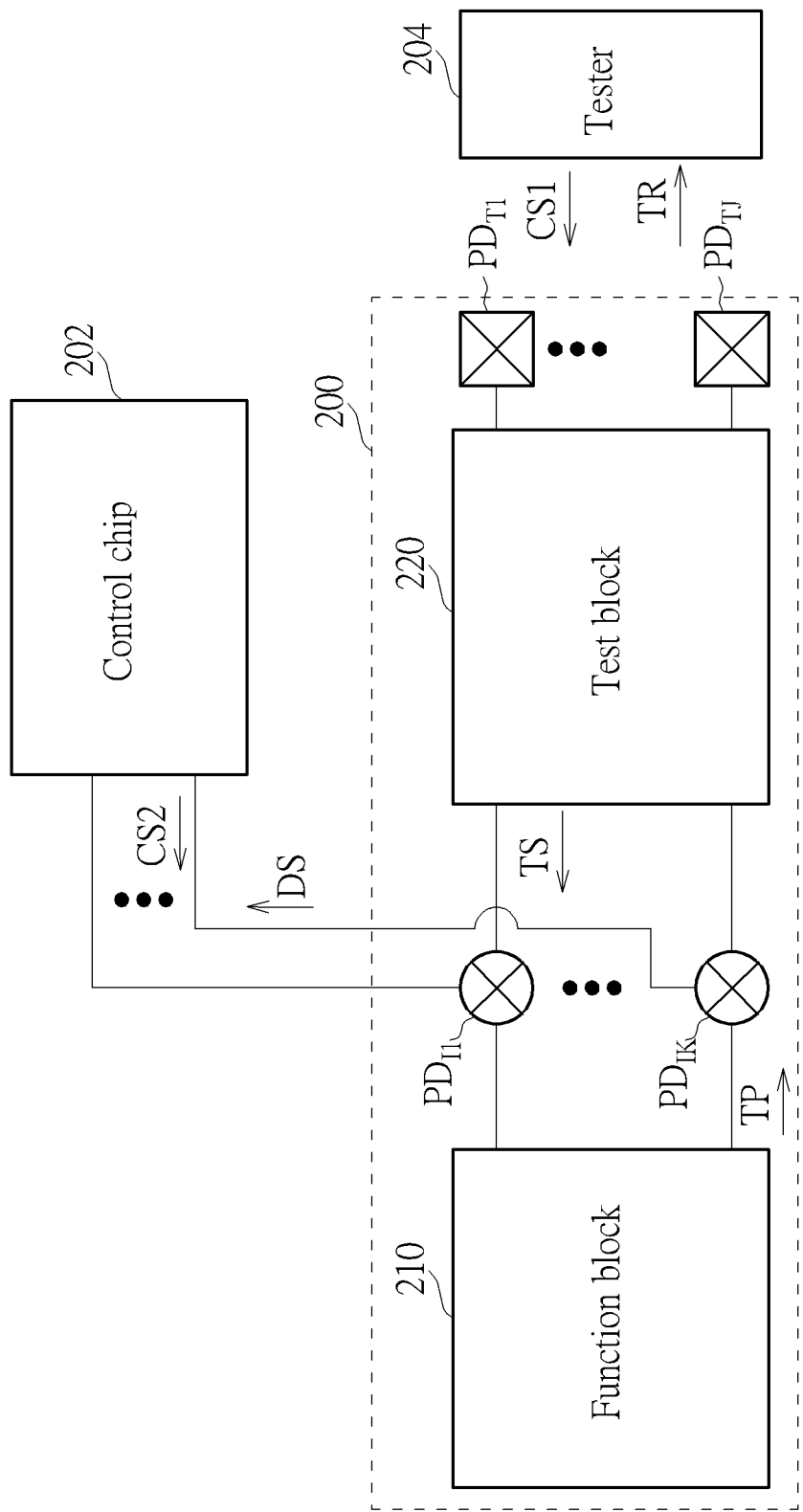
FIG. 2 is a diagram illustrating an exemplary memory chip architecture according to an embodiment of the present invention.

Please note that the chip with proposed circuit topology (the memory chip architecture 200) shown in FIG. 2 (or the memory chip architecture 100 shown in FIG. 1) is a basic architecture based on the concept of the present invention. Any test architecture employing the memory chip architecture 200/100 falls within the scope of the present invention. To facilitate an understanding of the present invention, exemplary implementations of a circuit topology of memory chips with embedded function test pattern generation module connected to the normal access PHY are given for further description of the proposed topology. It should be noted that the test signal is transmitted from the embedded test block to the function block through all the regular interface pads. There are no extra testing paths from to the test embedded block to the function block; the only paths are going through the regular interface pads only. This behavior is equivalent to the operation of control die/system.

To sum up, as the proposed circuit topology of memory chips with embedded function test pattern generation module connected to the normal access PHY may transmit a test signal through all interface pads (e.g. pads used for signal transmission between the function block/chip and the control die or system externally connected thereto) to test the function block/chip, rather than test the function block/chip by extra testing paths, the obtained test result will be equivalent to the operation result of the control die/system, thus realizing the testing of the whole function chip depends on the normal access PHY.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for use in a memory chip to test the memory chip, comprising: a plurality of test pads, for connecting to a tester; a plurality of interface pads, operable to function as one or more access ports under a normal operation, wherein the interface pads are connected to a physical layer (PHY) after assembly of the memory chip in a memory system; a core block, coupled to the interface pads, accessible by the interface pads; an embedded test block, disposed outside the core block, coupled to the test pads and the interface pads, wherein the embedded test block is arranged for generating at least one test pattern as a test signal, and outputting the test signal to the core block through the interface pads to test the core block as when the core block is accessed under a normal operation after assembly in the memory system, wherein the embedded test block comprises a test circuit, and the core block comprises a functional circuit; and in a test mode the test circuit receives a control input from the tester only through the test pads, generates the at least one test pattern as the test signal according to the control input, and outputs the test signal to the functional circuit only through the interface pads, to perform a die test operation so as to test the core block, wherein the interface pads is also the interface for signal transmission in the normal operation.

2. The circuit of claim 1, wherein the embedded test block and the core block are separately disposed in the memory chip; the functional circuit receives the test pattern to generate functional results and sends the functional results to the embedded test block; and the embedded test block feedbacks operating outputs to the tester.

3. The circuit of claim 1, wherein when the memory chip architecture operates in the test mode, the core block receives the test signal through the PHY with the interface pads from the embedded test block; and when the memory chip operates in a normal operation mode, the core block receives a control input generated from a control chip or a control system through the interface pads.

* * * * *